US012666725B2

(12) United States Patent
Lai et al.

(10) Patent No.: US 12,666,725 B2
(45) Date of Patent: Jun. 23, 2026

(54) CELL MODULE

(71) Applicant: INDUSTRIAL TECHNOLOGY RESEARCH INSTITUTE, Hsinchu (TW)

(72) Inventors: Chiou-Chu Lai, Zhubei City (TW); Chun-Wei Su, Zhubei City (TW); Yi-Chun Liu, Zhudong Township (TW); Hsin-Hsin Hsieh, Taipei City (TW); Hsin-Chung Wu, Sihu Township (TW); En-Yu Pan, Zhubei City (TW); Chin-Ping Huang, Hsinchu City (TW); Zih-Yu Fang, Tainan City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 18/928,788

(22) Filed: Oct. 28, 2024

(65) Prior Publication Data

US 2025/0056901 A1 Feb. 13, 2025

Related U.S. Application Data

(63) Continuation-in-part of application No. 18/525,139, filed on Nov. 30, 2023, now Pat. No. 12,419,118.

(30) Foreign Application Priority Data

| Mar. 6, 2023 | (TW) | ................................. 112108139 |
| Jul. 16, 2024 | (TW) | ................................. 113126571 |

(51) Int. Cl.
*H10F 19/80* (2025.01)

(52) U.S. Cl.
CPC .................................. *H10F 19/804* (2025.01)

(58) Field of Classification Search
CPC ............................... H10F 19/804; H10F 19/85
See application file for complete search history.

(56) References Cited

U.S. PATENT DOCUMENTS

| 12,419,118 B2 * | 9/2025 | Lai .......................... B32B 27/40 |
| 2018/0047863 A1 | 2/2018 | Jeon et al. |

(Continued)

FOREIGN PATENT DOCUMENTS

| TW | 201349527 A | 12/2013 |
| TW | 201716212 A | 5/2017 |

(Continued)

OTHER PUBLICATIONS

Taiwanese Office Action for Taiwanese Application No. 113126571, dated Jan. 23, 2025.

(Continued)

*Primary Examiner* — Tae-Sik Kang
(74) *Attorney, Agent, or Firm* — Birch, Stewart, Kolasch & Birch, LLP

(57) ABSTRACT

A cell module is provided. The cell module includes a first substrate; a second substrate disposed opposite to the first substrate; a cell unit disposed between the first substrate and the second substrate; a first thermosetting resin layer disposed between the cell unit and the first substrate; a crosslinked polymer layer disposed between the cell unit and the first thermosetting resin layer; and a second thermosetting resin layer disposed between the cell unit and the second substrate. The crosslinked polymer layer includes a crosslinked polymer, and the crosslinked polymer has a crosslinking degree of from 35.4 to 67.4%.

15 Claims, 1 Drawing Sheet

10

(56)          References Cited

U.S. PATENT DOCUMENTS

| | | |
|---|---|---|
| 2019/0172962 A1 | 6/2019 | Lin et al. |
| 2019/0245478 A1 | 8/2019 | de Vries et al. |
| 2021/0202770 A1* | 7/2021 | Kuan ..................... B32B 17/10 |
| 2021/0234055 A1 | 7/2021 | Wang et al. |
| 2021/0343886 A1 | 11/2021 | Sharenko et al. |
| 2022/0059713 A1 | 2/2022 | Selten et al. |
| 2022/0123162 A1 | 4/2022 | Sharenko et al. |

FOREIGN PATENT DOCUMENTS

| | | |
|---|---|---|
| TW | I647862 B | 1/2019 |
| TW | I726562 B | 5/2021 |
| TW | 202126486 A | 7/2021 |
| TW | I738594 B | 9/2021 |

OTHER PUBLICATIONS

Taiwanese Office Action and Search Report for Taiwanese Application No. 112108139, dated Dec. 27, 2023.

* cited by examiner

10

10

CELL MODULE

CROSS REFERENCE TO RELATED APPLICATIONS

This application claims priority of Taiwan Patent Application No. 113126571, filed on Jul. 16, 2024, the entirety of which is incorporated by reference herein. This application is a Continuation-In-Part of U.S. patent application Ser. No. 18/525,139, filed on Nov. 30, 2023, which claims priority of Taiwan Patent Application No. 112108139, filed on Mar. 6, 2023, and, the entirety of which are incorporated by reference herein.

TECHNICAL FIELD

The disclosure relates to a cell module.

BACKGROUND

Electricity generation through solar power involves the collection of heat energy from the sun by solar panels, which are then converted into electrical energy. Although no pollutants are generated during the electricity production process, solar panels have a certain lifespan. When the end of their lifespan is reached, the waste solar panels need to be replaced, which will generate a large amount of waste. Therefore, the issue of recycling and resource reuse has gradually emerged.

Taking conventional silicon crystal solar panels as an example, in order to extend its lifespan, thermosetting polymers are commonly used as encapsulating materials to encapsulate and fix polycrystalline or monocrystalline solar cells.

As the thermosetting polymers form intermolecular cross-linking network, solar cells cannot be separated from substrates (such as glass) by heating because the encapsulation film won't melt. Therefore, the conventional method includes directly crushing and disassembling the modules and then incinerating them to decompose the encapsulation film at high temperature, in order to isolate the glass and cells, making the recycled cells and glass not possible to be reused in their original undamaged forms.

Accordingly, one challenge encountered in the decomposition of conventional silicon crystal solar cell modules is how to remove the thermosetting plastic material so that the glass and cells can be extracted without damage for recycling.

Therefore, a novel design of solar cell modules with high reliability and easy disassembly properties addresses the issue of recycling discarded modules in the industry.

SUMMARY

The cell module includes a first substrate; a second substrate disposed opposite to the first substrate; a cell unit disposed between the first substrate and the second substrate; a first thermosetting resin layer disposed between the cell unit and the first substrate; a crosslinked polymer layer disposed between the cell unit and the first thermosetting resin layer; and, a second thermosetting resin layer disposed between the cell unit and the second substrate.

According to embodiments of the disclosure, the cross-linked polymer layer includes a crosslinked polymer, wherein the crosslinking degree of the crosslinked polymer is 35.4% to 67.4%.

A detailed description is given in the following embodiments.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
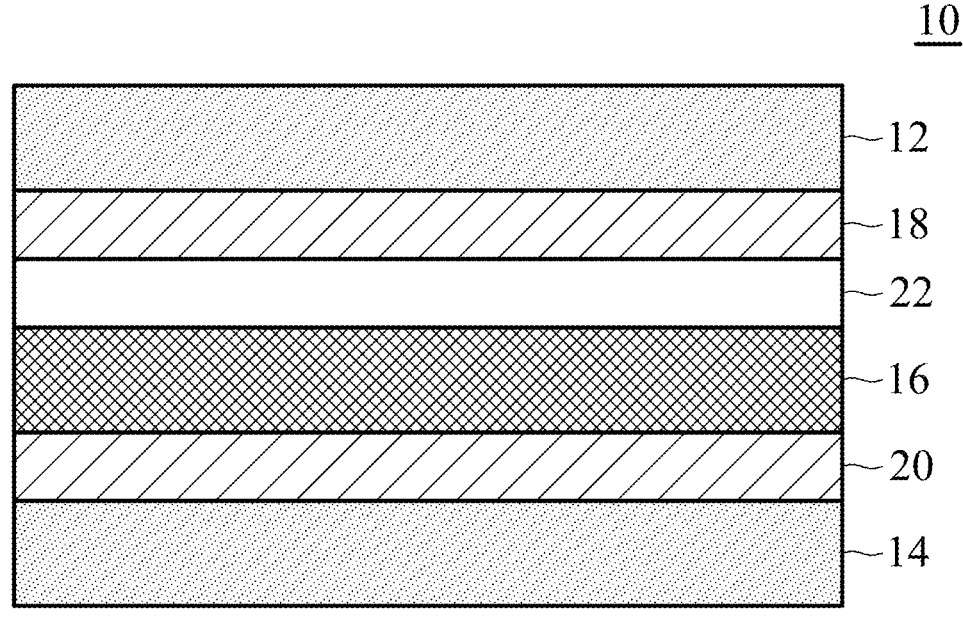
FIG. 1 is a cross-sectional view of the cell module 10 according to embodiments of the disclosure.

The cell module of the disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. As used herein, the term "about" in quantitative terms refers to plus or minus an amount that is general and reasonable to persons skilled in the art.

Furthermore, the use of ordinal terms such as "first", "second", "third", etc., in the disclosure to modify an element does not by itself connote any priority, precedence, order of one claim element over another or the temporal order in which it is formed, but are used merely as labels to distinguish one claim element having a certain name from another element having the same name (but for use of the ordinal term) to distinguish the claim elements.

It should be noted that the elements or devices in the drawings of the disclosure may be present in any form or configuration known to those skilled in the art. In addition, the expression "a layer overlying another layer", "a layer is disposed above another layer", "a layer is disposed on another layer", and "a layer is disposed over another layer" may refer to a layer that directly contacts the other layer, and they may also refer to a layer that does not directly contact the other layer, there being one or more intermediate layers disposed between the layer and the other layer.

The drawings described are only schematic and are non-limiting. In the drawings, the size, shape, or thickness of some of the elements may be exaggerated and not drawn on scale for illustrative purposes. The dimensions and the relative dimensions do not correspond to actual location to practice of the disclosure. The disclosure will be described with respect to particular embodiments and with reference to certain drawings but the disclosure is not limited thereto.

The disclosure provides a cell module, such as a solar cell module. According to embodiments of the disclosure, the cell module includes a crosslinked polymer layer and a cell unit (such as a solar cell), wherein the crosslinked polymer layer is disposed on the cell unit (i.e. the crosslinked polymer layer directly contacting the cell unit), and the crosslinked polymer layer includes a specific crosslinked polymer (such as a specific thermoplastic elastomer with a specific crosslinking degree). Due to the specific crosslinked polymer, the cell module of the disclosure can have good optical properties, high mechanical strength, high adhesion strength (without horizontal detachment, displacement and slippage), high reliability (anti-high temperature with humidity and anti-UV), thereby meeting the requirements of the cell module. In addition, the cell module of the disclosure can be easily disassembled and recycled by a simple thermal dissociation process or chemical dissociation process, which is not easy to cause broken cells and has the advantage of easy disassembly.

According to embodiments of the disclosure, the disclosure provides a cell module 10, such as a solar cell module. FIG. 1 shows a cross-sectional view of the cell module 10 according to embodiments of the disclosure.

As shown in FIG. 1, the cell module 10 includes a first substrate 12, a second substrate 14, a cell unit 16, a first thermosetting resin layer 18, a second thermosetting resin layer 20, and a crosslinked polymer layer 22. The first substrate 12 is disposed opposite to the second substrate 14. The cell unit 16 is disposed between the first substrate 12 and the second substrate 14. The first thermosetting resin layer 18 is disposed between the cell unit 16 and the first substrate 12. The second thermosetting resin layer 20 is disposed between the cell unit 16 and the second substrate 14. It should be noted that the crosslinked polymer layer 22 is disposed between the cell unit 16 and the first thermosetting resin layer 18, and the crosslinked polymer layer 22 may directly contact the cell unit 16. One side of the first thermosetting resin layer 18 contacts the crosslinked polymer layer 22, and another side of the first thermosetting resin layer 18 contacts the first substrate 12. Namely, the first thermosetting resin layer 18 does not directly contact the cell unit 16. One side of the second thermosetting resin layer 20 contacts the cell unit 16, and another side of the second thermosetting resin layer 20 contacts the second substrate 14.

According to embodiments of the disclosure, the material of the first substrate 12 and the second substrate 14 may be glass, polyolefin resin (such as linear olefin polymer or cyclic olefin polymer), polycarbonate resin, or polyester resin (such as polyethylene terephthalate (PET)). According to embodiments of the disclosure, linear olefin polymer may be polyethylene (PE), polypropylene (PP), ethylene-propylene copolymer (EPR), or copolymer of methyl methacrylate and styrene. According to embodiments of the disclosure, cyclic olefin polymer may be ethylene propylene diene monomer rubber (EPDM). In order to achieve the lightweight purpose of cell module 10, at least one of the first substrate 12 and the second substrate 14 may be prepared from polyolefin resin or polyester resin. According to embodiments of the disclosure, the thickness of the first substrate 12 and the second substrate 14 is not limited and may be optionally modified by a person of ordinary skill in the field.

According to embodiments of the disclosure, the first thermosetting resin layer 18 may include a first thermosetting resin or consist of the first thermosetting resin. When the first thermosetting resin layer 18 includes the first thermosetting resin, the amount of the first thermosetting resin is from 90 wt % to 100 wt %, based on the total weight of the first thermosetting resin layer 18. According to embodiments of the disclosure, the second thermosetting resin layer 20 may include a second thermosetting resin or consist of the second thermosetting resin. When the second thermosetting resin layer 20 includes the second thermosetting resin, the amount of the second thermosetting resin is from 90 wt % to 100 wt %, based on the total weight of the second thermosetting resin layer 20. According to embodiments of the disclosure, the first thermosetting resin or the second thermosetting resin may independently include thermosetting ethylene vinyl acetate (EVA) resin, thermosetting epoxy resin, thermosetting polyolefin resin, thermosetting polyurethane resin, thermosetting diblock resin, thermosetting triblock resin or a combination thereof.

According to embodiments of the disclosure, when the thermosetting resin of the first thermosetting resin layer 18 and the second thermosetting resin layer 20 are thermosetting ethylene vinyl acetate (EVA) resin, the amount of vinyl acetate (VA) in the ethylene vinyl acetate (EVA) resin (a copolymer) may be 25 wt % to 35 wt %. In some embodiments of the disclosure, the first thermosetting resin layer 18 and the second thermosetting resin layer 20 may further include an additive, such as curing initiator, antioxidant, crosslinking agent, or stabilizer. In some embodiments of the disclosure, the amount of the additive in the first thermosetting resin layer 18 or the second thermosetting resin layer 20 may be 1 wt % to 5 wt %. According to embodiments of the disclosure, the thickness of the first thermosetting resin layer 18 and the second thermosetting resin layer 20 is not limited and may be optionally modified by a person of ordinary skill in the field.

According to embodiments of the disclosure, the crosslinked polymer layer 22 may include s crosslinked polymer. According to embodiments of the disclosure, the crosslinked polymer has a crosslinking degree from 35.4% to 67.4%, such as 40%, 42.4%, 45%, 50%, 55%, 60% or 65%. According to embodiments of the disclosure, the crosslinked polymer layer 22 may consist of the crosslinked polymer. According to embodiments of the disclosure, the crosslinked polymer has a crosslinking degree from 42.4% to 67.4%.

According to embodiments of the disclosure, the crosslinked polymer may be a product of a first composition via a crosslinking reaction, wherein the first composition includes a first polymer and a first crosslinking agent. According to embodiments of the disclosure, the first polymer is an un-crosslinked polyolefin elastomer, polyurethane elastomer, polyester elastomer, or a combination thereof. According to embodiments of the disclosure, the amount of the first crosslinking agent may be 0.01% to 1% (such as 0.02%, 0.05%, 0.08%, 0.1%, 0.2%, 0.3%, 0.4%, 0.5%, 0.6%, 0.7%, 0.8%, or 0.9%), based on the weight of the first polymer.

According to embodiments of the disclosure, the polyolefin elastomer may be a homopolymer of an olefin monomer or a copolymer of olefin monomers. According to embodiments of the disclosure, the olefin monomer may be an $\alpha$-olefin-based monomer. For example, the olefin monomer may be ethylene, propylene, isobutylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, isoprene, tetrafluoroethylene, 1-decene, 1-dodecene, 1-tetradecene, 1-cetene, 1-octadecene, 1-icosene, cyclobutene, cyclopentene, cyclohexene, cyclooctene, 1,3-butadiene, 1,3-pentadiene, 3,4-dimethylcyclopentene, 3-methylcyclohexene, 2-(2-methylbutyl)-1-cyclohexene, 1,4-hexadiene, 4-methyl-1,4-hexadiene, 5-methyl-1,4-hexadiene, 7-methyl-1,6-octadiene, 3,7-dimethyl-1,6-octadiene, 5,7-dimethyl-1,6- octadiene, 1,7-octadiene, 3,7,11-trimethyl-1,6,10-octatriene, 6-methyl-1,5-heptadiene, 1,6-heptadiene, 1,8-nonadiene, 1,9-decadiene, or 1,10-undecanediene. According to embodiments of the disclosure, the polyolefin elastomer may be polyethylene (PE), polypropylene (PP), ethylene-propylene copolymer, poly(ethylene-octene), poly(ethylene-hexene), poly(ethylene-butene), poly(ethylene-heptene), polybutene, polypentene, or a combination thereof.

According to embodiments of the disclosure, the olefin monomer is composed of alkenyl and alkyl groups. Namely, the olefin monomer, except for having alkenyl and alkyl groups, does not have any other functional groups. According to embodiments of the disclosure, the olefin monomer does not contain oxygen atoms. According to embodiments of the disclosure, the olefin monomer does not have an alkoxy group, alkenoxy group, carboxyl group, or hydroxyl group. According to embodiments of the disclosure, the polyolefin elastomer is not an ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, or propylene-ethyl acrylate copolymer.

According to embodiments of the disclosure, the polyester elastomer may be aromatic polyester, aliphatic polyester, or aromatic/aliphatic polyester copolymer.

According to embodiments of the disclosure, the first composition may consist of the first polymer and the first crosslinking agent. According to embodiments of the disclosure, the first crosslinking agent may be acrylate compound, methacrylate compound, allyl compound, vinyl compound, or a combination thereof. For example, the first crosslinking agent may be triallyl cyanurate (TAC), triallyl isocyanurate (TAIC), triallylphosphate (TAP), triallyl borate (TAB), trimethallyl isocyanurate (TMAIC), trimethylolpropane triacrylate (TMPTA), trimethylolpropane trimethacrylate, diallylterephthalate (DATP), diallyl carbonate, diallyl maleate, diallyl fumarate, diallyl phosphite, trimethylolpropane diallyl ether, 1,1,2,2-tetraallyloxyethane, or a combination thereof.

According to embodiments of the disclosure, the first composition can further include a first initiator, wherein the amount of the first initiator may be 0.01 wt % to 4 wt % (such as 0.02%, 0.05%, 0.08%, 0.1%, 0.5%, 0.8%, 1%, 1.5%, 2%, 2.5%, or 3.5%), based on the weight of the first polymer. According to embodiments of the disclosure, the first composition may consist of the first polymer, the first crosslinking agent, and the first initiator.

According to embodiments of the disclosure, the first initiator may be a photo-initiator, thermal initiator, or a combination thereof. According to embodiments of the disclosure, the first initiator is not limited and can be optionally modified by a person of ordinary skill in the field. The first initiator may be azo compound, cyanovaleric-acid-based compound, peroxide, benzoin-based compound, acetophenone-based compound, thioxanthone-based compound, ketal compound, benzophenone-based compound, α-aminoacetophenone compound, acylphosphineoxide compound, biimidazole-based compound, triazine-based compound, or a combination thereof.

According to embodiments of the disclosure, the crosslinked polymer layer 22 may substantially consist of the crosslinked polymer of the disclosure. Namely, the crosslinked polymer of the disclosure serves as the main ingredient of the crosslinked polymer layer. According to embodiments of the disclosure, the amount of the crosslinked polymer (serving as the main ingredient) may be from 90 wt % to 100 wt % (such as 91 wt %, 92 wt %, 94 wt %, 96 wt %, or 98 wt %), based on the weight of the crosslinked polymer layer. According to embodiments of the disclosure, aside from the main ingredient, the crosslinked polymer layer may optionally contain a minor ingredient. According to embodiments of the disclosure, in the crosslinked polymer layer, the content of the minor ingredient can range from 0.1 wt % to 10 wt % (such as: 0.2 wt %, 0.5 wt %, 1 wt %, 2 wt %, 3 wt %, 4 wt %, 5 wt %, 6 wt %, 7 wt %, 8 wt %, or 9 wt %). According to embodiments of the disclosure, the minor ingredient may be another polymer (i.e., a polymer that is not the crosslinked polymer disclosed), or an additive (such as an adhesion promoter, leveling agent, surface treatment agent, viscosity modifier, stabilizer, or antioxidant).

According to embodiments of the disclosure, the thickness of the crosslinked polymer layer may be 100 μm to 800 μm (such as 150 μm, 200 μm, 250 μm, 300 μm, 350 μm, 400 μm, 450 μm, 500 μm, 550 μm, 600 μm, 650 μm, 700 μm, or 750 μm). If the thickness of the crosslinked polymer layer is too large, the risk of relative sliding between the layers would increase, thereby reducing the reliability of the cell module.

According to embodiments of the disclosure, the cell unit 16 may be solar cells (such as a solar cell module with a single light-receiving surface or a solar cell module with two light-receiving surfaces). According to embodiments of the disclosure, the solar cells used in the disclosure is not limited and can be optionally modified by a person of ordinary skill in the field.

According to embodiments of the disclosure, the first thermosetting resin layer 18 and the crosslinked polymer layer 22 can form a transparent composite encapsulation film by thermal compression bonding or co-extrusion process.

Figure 2:
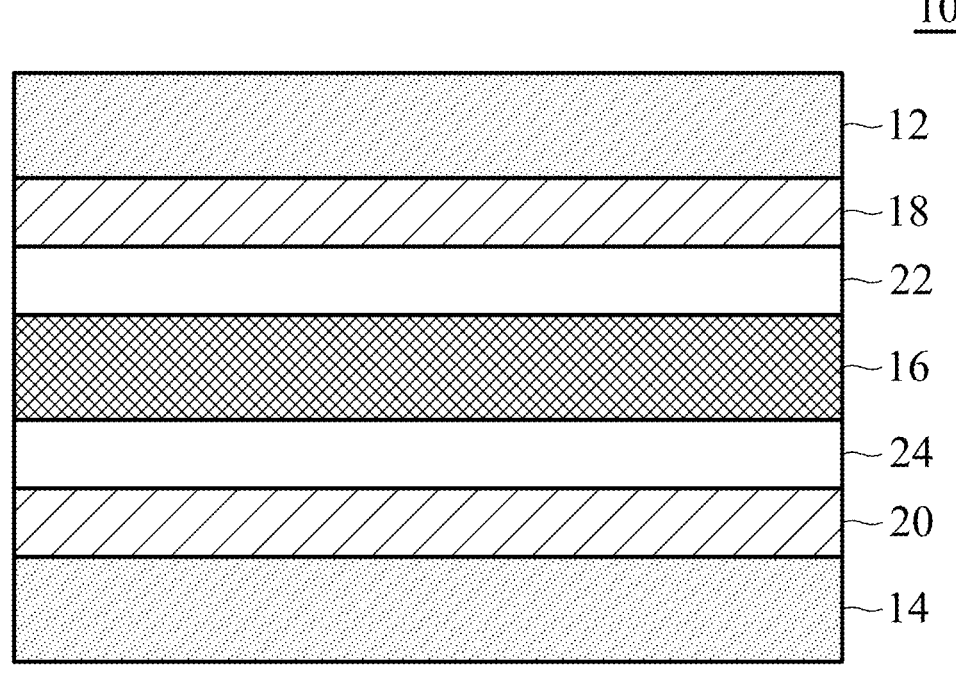
FIG. 2 is a cross-sectional view of the cell module 10 according to other embodiments of the disclosure.

According to embodiments of the disclosure, the cell module 10 of the disclosure can further include a protective layer 24, as shown in FIG. 2. The protective layer 24 may be disposed between the cell unit 16 and the second thermosetting resin layer 20. Namely, in the solar cell module 10 of the disclosure, the two sides of the cell unit 16 respectively contact the crosslinked polymer layer 22 and the protective layer 24. According to embodiments of the disclosure, the second thermosetting resin layer 20 and the protective layer 24 can form another transparent composite encapsulation film by thermal compression bonding or co-extrusion process. According to embodiments of the disclosure, the cell unit 16 is disposed between the crosslinked polymer layer 22 and the protective layer 24, thereby further increasing the dismantlability of the cell module 10.

According to embodiments of the disclosure, the main ingredient (i.e. crosslinked polymer) of the crosslinked polymer layer 22 may be the same as or different from the main ingredient of the protective layer 24.

According to embodiments of the disclosure, the thickness of the protective layer 24 may be from 100 μm to 800 μm (such as 150 μm, 200 μm, 250 μm, 300 μm, 350 μm, 400 μm, 450 μm, 500 μm, 550 μm, 600 μm, 650 μm, 700 μm, or 750 μm).

According to embodiments of the disclosure, the protective layer 24 may include a second polymer. According to embodiments of the disclosure, the second polymer has a crosslinking degree from 0% to 100%, such as 5%, 10%, 15%, 20%, 25%, 30%, 35%, 40%, 45%, 50%, 55%, 60%, 65%, 70%, 75%, 80%, 85%, 90%, or 95%. In addition, according to embodiments of the disclosure, the protective layer 24 may consist of the second polymer.

According to embodiments of the disclosure, the second polymer may have a crosslinking degree of 0 (i.e. the second polymer may be un-crosslinked). Herein, the second polymer may be an ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, propylene-ethyl acrylate copolymer, epoxy resin, polyolefin (such as polyolefin elastomer), polyurethane (such as polyurethane elastomer), polyester (such as polyester elastomer), or a combination thereof.

According to embodiments of the disclosure, the second polymer has a crosslinking degree less than or equal to 67.4%. When the second polymer has a crosslinking degree greater than 0% and less than or equal to 67.4%, the second polymer may be a product of a second composition via a crosslinking reaction, wherein the second composition includes an un-crosslinked polymer and a second crosslinking agent, wherein the amount of the second crosslinking agent may be 0.01% to 1% (such as 0.02%, 0.05%, 0.08%, 0.1%, 0.2%, 0.3%, 0.4%, 0.5%, 0.6%, 0.7%, 0.8%, or 0.9%), based on the weight of the second polymer. According to embodiments of the disclosure, the first polymer and the second polymer may be the same or different. In addition, according to embodiments of the disclosure, the first crosslinking agent and the second crosslinking agent may be the same or different.

According to embodiments of the disclosure, the un-crosslinked polymer may be an ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, propylene-ethyl acrylate copolymer, epoxy resin, polyolefin (such as polyolefin elastomer), polyurethane (such as polyurethane elastomer), polyester (such as polyester elastomer), or a combination thereof.

According to embodiments of the disclosure, the second crosslinking agent may be an acrylate compound, methacrylate compound, allyl compound, vinyl compound, or a combination thereof. For example, the second crosslinking agent may be triallyl cyanurate (TAC), triallyl isocyanurate (TAIC), triallylphosphate (TAP), triallyl borate (TAB), trimethallyl isocyanurate (TMAIC), trimethylolpropane triacrylate (TMPTA), trimethylolpropane trimethacrylate, diallylterephthalate (DATP), diallyl carbonate, diallyl maleate, diallyl fumarate, diallyl phosphite, trimethylolpropane diallyl ether, 1,1,2,2-tetraallyloxyethane, or a combination thereof.

According to embodiments of the disclosure, the second composition may further include a second initiator, wherein the amount of the second initiator may be 0.01 wt % to 4 wt % (such as 0.02%, 0.05%, 0.08%, 0.1%, 0.5%, 0.8%, 1%, 1.5%, 2%, 2.5%, or 3.5%), based on the weight of the second polymer. According to embodiments of the disclosure, the first initiator and the second initiator may be the same or different.

According to embodiments of the disclosure, the second initiator may be a photo-initiator, thermal initiator, or a combination thereof. According to embodiments of the disclosure, the initiator of the disclosure is not limited and may be optionally modified by a person of ordinary skill in the field, may be an azo compound, cyanovaleric-acid-based compound, peroxide, benzoin-based compound, acetophenone-based compound, thioxanthone-based compound, ketal compound, benzophenone-based compound, $\alpha$-amino-acetophenone compound, acylphosphine oxide compound, biimidazole-based compound, triazine-based compound, or a combination thereof.

It should be noted that, the disclosed cell module 10 can be easily disassembled and recycled by thermal dissociation process or chemical dissociation process. According to embodiments of the disclosure, the thermal dissociation process is performed at a specific temperature (such as 400° C. to 500° C.) to bake the cell module 10 to disassemble the cell module 10. In some embodiments of the disclosure, the chemical dissociation process is performed at a temperature less than 40° C. In the chemical dissociation process, the cell module 10 is immersed in a solvent to disassemble the cell module 10. In some embodiments of the disclosure, the solvent used in the chemical dissociation process may be a hydrocarbon solvent, such as toluene, 2-toluene, hexane, or cyclohexane.

Below, exemplary embodiments will be described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.
Crosslinked Polymer

Preparation Example 1

400 parts by weight of polyolefin elastomer (POE) (with a trade number of ENGAGE™ 8401, commercially available from Dow Inc.), 2.88 parts by weight of crosslinking agent (triallyl isocyanurate (TAIC), commercially available from Shinryo Corp), 0.16 parts by weight of initiator (with a trade number of LUPEROX 101L, commercially available from ATOFINA Chemicals), 2.56 parts by weight of initiator (with a trade number of LUPEROX 117L, commercially available from ATOFINA Chemicals), and 10 parts by weight of initiator (dicumyl peroxide (DCP)) were mixed, obtaining Composition (1).

Next, Composition (1) was subjected to a thermal compression process (pressed at 130° C.-150° C. for about 15 minutes to 30 minutes) under vacuum, obtaining Crosslinked polymer film (1) (with a thickness of about 500 μm). Next, the crosslinking degree of Crosslinked polymer film (1) was measured, and the results are shown in Table 1, wherein the crosslinking degree was determined by the method according to ASTM-D2765.

Preparation Example 2

400 parts by weight of polyolefin elastomer (POE) (with a trade number of ENGAGE™ 8401, commercially available from Dow Inc.), 1.92 parts by weight of crosslinking agent (triallyl isocyanurate (TAIC), commercially available from Shinryo Corp), 0.16 parts by weight of initiator (with a trade number of LUPEROX 101L, commercially available from ATOFINA Chemicals), 2.56 parts by weight of initiator (with a trade number of LUPEROX 117L, commercially available from ATOFINA Chemicals), and 6.67 parts by weight of initiator (dicumyl peroxide (DCP)) were mixed, obtaining Composition (2).

Next, Composition (2) was subjected to a thermal compression process (pressed at 130° C.-150° C. for about 15 minutes to 30 minutes) under vacuum, obtaining Crosslinked polymer film (2) (with a thickness of about 500 μm). Next, the crosslinking degree of Crosslinked polymer film (2) was measured, and the results are shown in Table 1.

Preparation Example 3

400 parts by weight of polyolefin elastomer (POE) (with a trade number of ENGAGE™ 8401, commercially available from Dow Inc.), 1.28 parts by weight of crosslinking agent (triallyl isocyanurate (TAIC), commercially available 30 minutes) under vacuum, obtaining the POE film (with a thickness of about 500 μm). Next, the crosslinking degree of the POE film was measured, and the results are shown in Table 1.

Thermosetting EVA Film 400 parts by weight of thermosetting ethylene-vinyl acetate copolymer (EVA) (with a trade number of SV-15296P, commercially available from SVECK Technology) was subjected to a thermal compression process (pressed at 130° C.-150° C. for about 15 minutes to 30 minutes) under vacuum, obtaining the thermosetting EVA film (with a thickness of about 500 μm).

TABLE 1

| | ENGAGE ™ 8401 (parts by weight) | TAIC (parts by weight) | LUPEROX 101L (parts by weight) | LUPEROX 117L (parts by weight) | DCP (parts by weight) | crosslinking degree of film (%) |
|---|---|---|---|---|---|---|
| Preparation Example 1 | 400 | 2.88 | 0.16 | 2.56 | 10 | 67.4 |
| Preparation Example 2 | 400 | 1.92 | 0.16 | 2.56 | 6.67 | 52.9 |
| Preparation Example 3 | 400 | 1.28 | 0.16 | 2.56 | 4.45 | 35.4 |
| Preparation Example 4 | 400 | 4.32 | 0.16 | 2.56 | 15 | 83.85 |
| POE film | 100% polyolefin elastomer (with a trade number of ENGAGE ™ 8401) | | | | | 0 | from Shinryo Corp), 0.16 parts by weight of initiator (with a trade number of LUPEROX 101L, commercially available from ATOFINA Chemicals), 2.56 parts by weight of initiator (with a trade number of LUPEROX 117L, commercially available from ATOFINA Chemicals), and 4.45 parts by weight of initiator (dicumyl peroxide (DCP)) were mixed, obtaining Composition (3).

Next, Composition (3) was subjected to a thermal compression process (pressed at 130° C.-150° C. for about 15 minutes to 30 minutes) under vacuum, obtaining Crosslinked polymer film (3) (with a thickness of about 500 μm). Next, the crosslinking degree of Crosslinked polymer film (3) was measured, and the results are shown in Table 1.

Preparation Example 4

400 parts by weight of polyolefin elastomer (POE) (with a trade number of ENGAGE™ 8401, commercially available from Dow Inc.), 4.32 parts by weight of crosslinking agent (triallyl isocyanurate (TAIC), commercially available from Shinryo Corp), 0.16 parts by weight of initiator (with a trade number of LUPEROX 101L, commercially available from ATOFINA Chemicals), 2.56 parts by weight of initiator (with a trade number of LUPEROX 117L, commercially available from ATOFINA Chemicals), and 15 parts by weight of initiator (dicumyl peroxide (DCP)) were mixed, obtaining Composition (4).

Next, Composition (4) was subjected to a thermal compression process (pressed at 130° C.-150° C. for about 15 minutes to 30 minutes) under vacuum, obtaining Crosslinked polymer film (4) (with a thickness of about 500 μm). Next, the crosslinking degree of Crosslinked polymer film (4) was measured, and the results are shown in Table 1.

POE Film 400 parts by weight of polyolefin elastomer (POE) (with a trade number of ENGAGE™ 8401, commercially available from Dow Inc.) was subjected to a thermal compression process (pressed at 130° C.-150° C. for about 15 minutes to Evaluation of Optical Properties

Example 1

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.) were provided, and Crosslinked polymer film (1) of Preparation Example 1, the thermosetting EVA film and the first transparent glass were sequentially disposed on the second transparent glass. Next, the obtained structure was subjected to a thermal compression bonding process (pressed at 130° C.-150° C. for about 15 minutes to 30 minutes) under vacuum, obtaining Laminate (1) (i.e. a laminate having a structure of first transparent glass/thermosetting EVA film/Crosslinked polymer film (1)/second transparent glass). Next, the total luminous transmittance and haze of Laminate (1) were measured, and the results are shown in Table 2. The total luminous transmittance and haze were determined by the method according to ISO13468 via a spectrophotometer under D65 illumination.

Example 2

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.) were provided, and Crosslinked polymer film (2) of Preparation Example 2, the thermosetting EVA film and the first transparent glass were sequentially disposed on the second transparent glass. Next, the obtained structure was subjected to a thermal compression bonding process (pressed at 130° C.-150° C. for about 15 minutes to 30 minutes) under vacuum, obtaining Laminate (2) (i.e. a laminate having a structure of first transparent glass/thermosetting EVA film/Crosslinked polymer film (2)/second transparent glass). Next, the total luminous transmittance and haze of Laminate (2) were measured, and the results are shown in Table 2.

Example 3

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.) were provided, and Crosslinked polymer film (3) of Preparation Example 3, the thermosetting EVA film and the first transparent glass were sequentially disposed on the second transparent glass. Next, the obtained structure was subjected to a thermal compres-

Comparative Example 2

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.), and the POE film, the thermosetting EVA film and the first transparent glass were sequentially disposed on the second transparent glass. Next, the obtained structure was subjected to a thermal compression bonding process (pressed at 130° C.-150° C. for about 15 minutes to 30 minutes) under vacuum, obtaining Laminate (5) (i.e. a laminate having a structure of first transparent glass/thermosetting EVA film/POE film/second transparent glass). Next, the total luminous transmittance and haze of Laminate (5) were measured, and the results are shown in Table 2

TABLE 2

| | laminate structure | crosslinking degree of crosslinked polymer film (%) | total luminous transmittance (%) | haze (%) |
|---|---|---|---|---|
| Example 1 | glass/thermosetting EVA film/Crosslinked polymer film (1)/glass | 67.4 | 97.3 | 3.46 |
| Example 2 | glass/thermosetting EVA film/Crosslinked polymer film (2)/glass | 52.9 | 97.0 | 3.83 |
| Example 3 | glass/thermosetting EVA film/Crosslinked polymer film (3)/glass | 35.4 | 97.1 | 3.46 |
| Comparative Example 1 | glass/thermosetting EVA film/Crosslinked polymer film (4)/glass | 83.85 | 97.3 | 3.49 |
| Comparative Example 2 | glass/thermosetting EVA film/POE film/glass | 0 | 97 | 3.83 | sion bonding process (pressed at 130° C.-150° C. for about 15 minutes to 30 minutes) under vacuum, obtaining Laminate (3) (i.e. a laminate having a structure of first transparent glass/thermosetting EVA film/Crosslinked polymer film (3)/second transparent glass). Next, the total luminous transmittance and haze of Laminate (3) were measured, and the results are shown in Table 2.

Comparative Example 1

A first transparent glass (with a thickness of about 3.2 mm) (with a trade number of super clear glass, commercially available from TAIWAN GLASS IND. CORP.) and a second transparent glass (with a thickness of about 3.2 mm) (with a trade number of super clear glass, commercially available from TAIWAN GLASS IND. CORP.) were provided, and Crosslinked polymer film (4) of Preparation Example 4, the thermosetting EVA film and the first transparent glass were sequentially disposed on the second transparent glass. Next, the obtained structure was subjected to a thermal compression bonding process (pressed at 130° C.-150° C. for about 15 minutes to 30 minutes) under vacuum, obtaining Laminate (4) (i.e. a laminate having a structure of first transparent glass/thermosetting EVA film/Crosslinked polymer film (4)/second transparent glass). Next, the total luminous transmittance and haze of Laminate (4) were measured, and the results are shown in Table 2.

As shown in Table 2, the laminates prepared by combining the crosslinked polymer film of the disclosure and the thermosetting EVA film (i.e. the laminates of Examples 1-3) have high total luminous transmittance and low haze.
Evaluation of Mechanical Strength

Example 4

Crosslinked polymer film (1) was disposed on the thermosetting EVA film. Next, the obtained structure was subjected to a thermal compression bonding process (pressed at 130° C.-150° C. for about 15 minutes to 30 minutes) under vacuum, obtaining Laminate (6) (i.e. a laminate having a structure of Crosslinked polymer film (1)/thermosetting EVA film) (with a thickness of about 1 mm). Next, the tensile strength at break and volume resistivity of Laminate (6) were measured, and the results are shown in Table 3. The tensile strength at break was determined by the method according to ASTM D 638, and the volume resistivity was determined by the method according to IEC 62788 January 2.

Example 5

Crosslinked polymer film (2) was disposed on the thermosetting EVA film. Next, the obtained structure was subjected to a thermal compression bonding process (pressed at 130° C.-150° C. for about 15 minutes to 30 minutes) under vacuum, obtaining Laminate (7) (i.e. a laminate having a structure of Crosslinked polymer film (2)/thermosetting EVA film) (with a thickness of about 1 mm). Next, the tensile strength at break and volume resistivity of Laminate (7) were measured, and the results are shown in Table 3.

Example 6

Crosslinked polymer film (3) was disposed on the thermosetting EVA film. Next, the obtained structure was subjected to a thermal compression bonding process (pressed at 130° C.-150° C. for about 15 minutes to 30 minutes) under vacuum, obtaining Laminate (8) (i.e. a laminate having a structure of Crosslinked polymer film (3)/thermosetting EVA film) (with a thickness of about 1 mm). Next, the tensile strength at break and volume resistivity of Laminate (8) were measured, and the results are shown in Table 3.

Comparative Example 3

Crosslinked polymer film (4) was disposed on the thermosetting EVA film. Next, the obtained structure was subjected to a thermal compression bonding process (pressed at 130° C.-150° C. for about 15 minutes to 30 minutes) under vacuum, obtaining Laminate (9) (i.e. a laminate having a structure of Crosslinked polymer film (4)/thermosetting EVA film) (with a thickness of about 1 mm). Next, the tensile strength at break and volume resistivity of Laminate (9) were measured, and the results are shown in Table 3.

Comparative Example 4

POE film was disposed on the thermosetting EVA film. Next, the obtained structure was subjected to a thermal compression bonding process (pressed at 130° C.-150° C. for about 15 minutes to 30 minutes) under vacuum, obtaining Laminate (10) (i.e. a laminate having a structure of POE film/thermosetting EVA film) (with a thickness of about 1 mm). Next, the tensile strength at break and volume resistivity of Laminate (10) were measured, and the results are shown in Table 3.

laminate structure was subjected to a thermal compression bonding process (pressed at 130° C.-150° C. for about 15 minutes to 30 minutes) under vacuum, obtaining Solar cell module (1). Materials and dimensions of the components of Solar cell module (1) were listed as following. The first substrate 12 was transparent glass (with a thickness of about 3.2 mm) (with a trade number of super clear glass, commercially available from TAIWAN GLASS IND. CORP.). The second substrate 14 was a solar module back sheet (with a trade number of FFC-JW3020, commercially available from Jolywood) (with a thickness of about 0.31 mm). The cell unit 16 was a solar cell (with a thickness of about 180 μm) (commercially available from Motech Industries, Inc.). The first thermosetting resin layer 18 was a thermosetting ethylene-vinyl acetate copolymer (EVA) film (with a trade number of SV-15296P, commercially available from SVECK TECHNOLOGY) (with a thickness of about 500 μm). The second thermosetting resin layer 20 was a thermosetting ethylene-vinyl acetate copolymer (EVA) film (with a trade number of SV-15297W, commercially available from SVECK TECHNOLOGY) (with a thickness of about 500 μm). The crosslinked polymer layer 22 was Crosslinked polymer film (1) of Preparation Example 1 (with a thickness about 500 μm).

Example 8

Example 8 was performed in the same manner as in Example 7, except that the crosslinked polymer layer 22 was Crosslinked polymer film (2) of Preparation Example 2 (with a thickness about 500 μm), obtaining Solar cell module (2).

Example 9

Example 9 was performed in the same manner as in Example 7, except that the crosslinked polymer layer 22 was

TABLE 3

| | laminate structure | crosslinking degree of crosslinked polymer film (%) | tensile strength at break (MPa) | volume resistivity (Ω · cm) |
|---|---|---|---|---|
| Example 4 | Crosslinked polymer film (1)/thermosetting EVA film | 67.4 | 20.09 | 7.95E+15 |
| Example 5 | Crosslinked polymer film (2)/thermosetting EVA film | 52.9 | 20.91 | 4.00E+15 |
| Example 6 | Crosslinked polymer film (3)/thermosetting EVA film | 35.4 | 12.71 | 6.32E+14 |
| Comparative Example 3 | Crosslinked polymer film (4)/thermosetting EVA film | 83.85 | 22.88 | 7.90E+15 |
| Comparative Example 4 | POE film/thermosetting EVA film | 0 | 9.46 | 2.17E+14 |

As shown in Table 3, the laminate structure having the crosslinked polymer film of the disclosure and the thermosetting EVA film exhibits high tensile strength at break and volume resistivity.

Solar Cell Module

Example 7

Herein, Solar cell module (1) was assembled to obtain the solar cell module 10 as shown in FIG. 1. The obtained Crosslinked polymer film (3) of Preparation Example 3 (with a thickness about 500 μm), obtaining Solar cell module (3).

Comparative Example 5

Comparative Example 5 was performed in the same manner as in Example 7, except that the crosslinked polymer layer 22 was Crosslinked polymer film (4) of Preparation Example 4 (with a thickness about 500 μm), obtaining Solar cell module (4).

Comparative Example 6

Comparative Example 6 was performed in the same manner as in Example 7, except that the crosslinked polymer layer 22 was the POE film (prepared from polyolefin elastomer (with a trade number of ENGAGE™ 8401, commercially available from Dow Inc)) (with a thickness about 500 μm), obtaining Solar cell module (5).
Disassembly Solar cell modules (1)-(4) of Examples 7-9 and Comparative Example 5 were disassembled via a thermal dissociation process. First, the solar cell module was baked at 450° C. and the recycled solar cells were observed to determine their completeness. If the disassembled solar cell remains intact (without broken, fragmented or damaged), it was marked with O. If the disassembled solar cell was broken, fragmented or damaged, it was marked with X. The results are shown in Table 4.

TABLE 4

| | Solar cell module | crosslinking degree of crosslinked polymer layer (%) | thickness of crosslinked polymer layer (μm) | Disassembly results |
|---|---|---|---|---|
| Example 7 | Solar cell module (1) | 67.4 | 500 | O |
| Example 8 | Solar cell module (2) | 52.9 | 500 | O |
| Example 9 | Solar cell module (3) | 35.4 | 500 | O |
| Comparative Example 5 | Solar cell module (4) | 83.85 | 500 | X |

As shown in Table 4, the solar cell modules of the disclosure (i.e. Solar cell modules (1)-(3) of Examples 7-9) could be disassembled via a thermal dissociation process (with a temperature of about 450° C.) and the recycled solar cells remain intact (without broken, fragmentation or damage) due to the specific crosslinked polymer layer (including the specific crosslinked polymer with the specific crosslinking degree range). Therefore, the solar cell modules of the disclosure have the advantage of easy disassembly. In addition, when the crosslinking degree of the crosslinked polymer layer used in the solar cell module is too high (such as 83.85%), the cells of the solar cell modules (i.e. Solar cell module (4) of Comparative Example 5) could not remain intact after being disassembled via thermal dissociation process (with a temperature of about 450° C.).
Reliability Test of Solar Cell Module After hanging Solar cell modules (1)-(3) and (5) of Examples 7-9 and Comparative Example 6 at 120° C. for 144 hours, the Solar cell modules were observed whether a relative sliding between the glass and solar cells occurred or not to determine the reliability of the solar cell modules. If no relative sliding between the glass and solar cells is observed after 144 hours, it is marked with O. If a relative sliding is observed within 144 hours, it is marked with X. The results are shown in Table 5.

TABLE 5

| | Solar cell module | crosslinking degree of crosslinked polymer layer (%) | thickness of crosslinked polymer layer (μm) | reliability test |
|---|---|---|---|---|
| Example 7 | Solar cell module (1) | 67.4 | 500 | O |
| Example 8 | Solar cell module (2) | 52.9 | 500 | O |
| Example 9 | Solar cell module (3) | 35.4 | 500 | O |
| Comparative Example 6 | Solar cell module (5) | 0 | 500 | X |

As shown in Table 5, the solar cell modules of the disclosure exhibit high reliability (without horizontal detachment, displacement and slippage) due to the specific crosslinked polymer layer (including the specific crosslinked polymer with the specific crosslinking degree range).

Accordingly, by means of the use of a specific crosslinked polymer layer and structural design, the cell modules of the disclosure exhibit excellent optical properties, high mechanical strength, and high adhesion strength (not prone to horizontal detachment, displacement, or slippage), meeting the requirements of a cell module. In addition, the cell module of the disclosure can be easily disassembled and recycled by a simple thermal dissociation process or chemical dissociation process, which is not easy to cause broken cells and has the advantage of easy disassembly.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cell module, comprising:
a first substrate;
a second substrate disposed opposite to the first substrate;
a cell unit disposed between the first substrate and the second substrate;
a first thermosetting resin layer disposed between the cell unit and the first substrate;
a crosslinked polymer layer disposed between the cell unit and the first thermosetting resin layer, wherein the crosslinked polymer layer comprises a crosslinked polymer, and the crosslinked polymer has a crosslinking degree from 35.4% to 67.4%, wherein the crosslinked polymer is a reaction product of a first composition, wherein the first composition includes a first polymer and a first crosslinking agent, wherein the first crosslinking agent has an amount between 0.01 wt % to 1 wt %, based on the weight of the first polymer; and
a second thermosetting resin layer disposed between the cell unit and the second substrate.

2. The cell module as claimed in claim 1, wherein the crosslinked polymer layer has a thickness of 100 µm to 800 µm.

3. The cell module as claimed in claim 1, wherein the first polymer is polyolefin elastomer, polyurethane elastomer, polyester elastomer, or a combination thereof.

4. The cell module as claimed in claim 3, wherein the polyolefin elastomer is polyethylene (PE), polypropylene (PP), ethylene-propylene copolymer, poly(ethylene-octene), poly(ethylene-hexene), poly(ethylene-butene), poly(ethylene-heptene), polybutene, polypentene, or a combination thereof.

5. The cell module as claimed in claim 3, wherein the polyolefin elastomer is a homopolymer of an olefin monomer or a copolymer of olefin monomers.

6. The cell module as claimed in claim 5, wherein the olefin monomer is ethylene, propylene, isobutylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, isoprene, tetrafluoroethylene, 1-decene, 1-dodecene, 1-tetradecene, 1-cetene, 1-octadecene, 1-icosene, cyclobutene, cyclopentene, cyclohexene, cyclooctene, 1,3-butadiene, 1,3-pentadiene, 3,4-dimethylcyclopentene, 3-methylcyclohexene, 2-(2-methylbutyl)-1-cyclohexene, 1,4-hexadiene, 4-methyl-1,4-hexadiene, 5-methyl-1,4-hexadiene, 7-methyl-1,6-octadiene, 3,7-dimethyl-1,6-octadiene, 5,7-dimethyl-1,6-octadiene, 1,7-octadiene, 3,7,11-trimethyl-1,6,10-octatriene, 6-methyl-1,5-heptadiene, 1,6-heptadiene, 1,8-nonadiene, 1,9-decadiene, or 1,10-undecanediene.

7. The cell module as claimed in claim 3, wherein the polyester elastomer is aromatic polyester, aliphatic polyester, or aromatic/aliphatic polyester copolymer.

8. The cell module as claimed in claim 1, wherein the first crosslinking agent is acrylate compound, methacrylate compound, allyl compound, vinyl compound, triallyl cyanurate, triallyl isocyanurate, triallylphosphate, triallyl borate, trimethallyl isocyanurate, trimethylolpropane triacrylate, trimethylolpropane trimethacrylate, diallylterephthalate, diallyl carbonate, diallyl maleate, diallyl fumarate, diallyl phosphite, trimethylolpropane diallyl ether, 1,1,2,2-tetraallyloxyethane, or a combination thereof.

9. The cell module as claimed in claim 1, wherein the first composition further comprises a first initiator.

10. The cell module as claimed in claim 9, wherein the first initiator has an amount between 0.01 wt % to 4 wt %, based on the weight of the first polymer.

11. The cell module as claimed in claim 9, wherein the first initiator is azo compound, cyanovaleric-acid-based compound, peroxide, benzoin-based compound, acetophenone-based compound, thioxanthone-based compound, ketal compound, benzophenone-based compound, α-aminoacetophenone compound, acylphosphineoxide compound, biimidazole-based compound, triazine-based compound, or a combination thereof.

12. The cell module as claimed in claim 1, wherein the crosslinked polymer has a crosslinking degree from 42.4% to 67.4%.

13. The cell module as claimed in claim 1, further comprising:

a protective layer disposed between the cell unit and the second thermosetting resin layer.

14. The cell module as claimed in claim 13, wherein the protective layer comprises a second polymer, and the second polymer has a crosslinking degree of 0.

15. The cell module as claimed in claim 13, wherein the protective layer comprises a second polymer, and the second polymer is a reaction product of a second composition, wherein the second composition comprises an un-crosslinked polymer and a second crosslinking agent, and the second crosslinking agent has an amount of 0.01% to 1%, based on the weight of the second polymer.

* * * * *